US009949029B2

United States Patent
Barratt

(10) Patent No.: US 9,949,029 B2
(45) Date of Patent: *Apr. 17, 2018

(54) AUDIO FILTERING WITH VIRTUAL SAMPLE RATE INCREASES

(71) Applicant: Lachlan Paul Barratt, Summer Hill (AU)

(72) Inventor: Lachlan Paul Barratt, Summer Hill (AU)

(*) Notice: Subject to any disclaimer, the term of this patent is extended or adjusted under 35 U.S.C. 154(b) by 0 days.

This patent is subject to a terminal disclaimer.

(21) Appl. No.: 14/780,387

(22) PCT Filed: Mar. 26, 2014

(86) PCT No.: PCT/AU2014/000325
§ 371 (c)(1),
(2) Date: Sep. 25, 2015

(87) PCT Pub. No.: WO2014/153609
PCT Pub. Date: Oct. 2, 2014

(65) Prior Publication Data
US 2016/0057535 A1    Feb. 25, 2016

Related U.S. Application Data

(60) Provisional application No. 61/903,225, filed on Nov. 12, 2013, provisional application No. 61/819,630, (Continued)

(51) Int. Cl.
*H04R 3/04*      (2006.01)
*H03H 17/02*    (2006.01)
(Continued)

(52) U.S. Cl.
CPC ............ *H04R 3/04* (2013.01); *G06F 3/165* (2013.01); *G06T 5/00* (2013.01); *G10L 21/0332* (2013.01);
(Continued)

(58) Field of Classification Search
None
See application file for complete search history.

(56) References Cited

U.S. PATENT DOCUMENTS 5,270,481 A    12/1993   Matsunaga et al.
5,907,295 A     5/1999   Lin
(Continued)

FOREIGN PATENT DOCUMENTS

CN        101930736 A    12/2010
EP         0 795 755 A2     9/1997
(Continued)

OTHER PUBLICATIONS

Zhou et al, "Integrated IF SAW filter in baseband digital design for analog TV (or hybrid) tuner." pp. 1-28. published May 26, 2011. WO2011063361.*

(Continued)

*Primary Examiner* — Curtis Kuntz
*Assistant Examiner* — Qin Zhu
(74) *Attorney, Agent, or Firm* — Maschoff Brennan

(57) ABSTRACT

The present invention relates broadly to a method of digitally filtering an audio signal by applying a composite audio filter. The composite audio filter may be obtained by applying one audio filter to another audio filter each having the same predetermined sample rate including neighboring sample points. The other audio filter may also include one or more intervening sample points between adjacent of its neighboring sample points. The one audio filter may be applied to the other audio filter at an adjusted sampling rate relative to the other audio filter. The adjusted sampling rate may be inversely proportional to the number of intervening sample points relative to the number of neighboring sample points for the other filter. The frequency response curve for the composite filter derived using the adjusted sampling rate (Continued)

Figure 4 may be more indicative of an idealized lowpass filter. The frequency response with the adjusted sampling rate may display a more bell-shaped characteristic compared with the frequency response without an adjusted sampling rate (shown in broken line detail).

16 Claims, 10 Drawing Sheets

Related U.S. Application Data filed on May 5, 2013, provisional application No. 61/805,469, filed on Mar. 26, 2013, provisional application No. 61/805,406, filed on Mar. 26, 2013, provisional application No. 61/805,432, filed on Mar. 26, 2013, provisional application No. 61/805,466, filed on Mar. 26, 2013, provisional application No. 61/805,449, filed on Mar. 26, 2013, provisional application No. 61/805,463, filed on Mar. 26, 2013.

(51) Int. Cl.
    *G10L 21/0332*      (2013.01)
    *G06T 5/00*      (2006.01)
    *G06F 3/16*      (2006.01)
    *H04R 1/22*      (2006.01)
    *H03H 17/06*      (2006.01)

(52) U.S. Cl.
    CPC .... *H03H 17/0266* (2013.01); *H03H 17/0286* (2013.01); *H04R 1/22* (2013.01); *G06T 2207/20024* (2013.01); *G06T 2207/20172* (2013.01); *H03H 17/0248* (2013.01); *H03H 17/0657* (2013.01)

(56) References Cited

U.S. PATENT DOCUMENTS

| | | | | |
|---|---|---|---|---|
| 6,236,731 B1* | 5/2001 | Brennan | ............ | H03H 17/0266 381/312 |
| 6,856,653 B1* | 2/2005 | Taniguchi | .......... | H03H 17/0266 375/285 |
| 7,167,112 B2* | 1/2007 | Andersen | ........... | H03H 17/0621 341/61 |
| 7,612,281 B2* | 11/2009 | Nakae | ................... | G10H 1/0091 700/94 |
| 8,644,520 B2* | 2/2014 | Napoletano | ............. | G10K 15/08 381/310 |
| 8,943,117 B1* | 1/2015 | Torosyan | ................ | G06F 17/14 708/315 |
| 2002/0116427 A1* | 8/2002 | Jiang | .................. | H03H 17/0685 708/313 |
| 2003/0002542 A1* | 1/2003 | Lin | .................... | H03H 17/0657 370/537 |
| 2003/0154224 A1 | 8/2003 | Jiang et al. | | |
| 2004/0184573 A1* | 9/2004 | Andersen | ........... | H03H 17/0621 375/372 |
| 2008/0192957 A1* | 8/2008 | Kubo | ....................... | H04R 3/04 381/103 |
| 2009/0319065 A1 | 12/2009 | Risbo | | |
| 2011/0144934 A1 | 6/2011 | Bilgin et al. | | |
| 2011/0145310 A1 | 6/2011 | Philippe et al. | | |
| 2012/0027128 A1* | 2/2012 | Foote | .................. | H03M 1/1245 375/316 |
| 2013/0044896 A1* | 2/2013 | Ekstrand | .................. | G10H 1/16 381/98 |
| 2013/0083945 A1* | 4/2013 | Rossum | ............. | H03H 17/0288 381/98 |

FOREIGN PATENT DOCUMENTS

| | | |
|---|---|---|
| EP | 2341621 A2 | 7/2011 |
| WO | 2011063361 A1 | 5/2011 |

OTHER PUBLICATIONS

Extended European Search Report dated Mar. 1, 2017 as received in Application No. 14775520.1.
CN Office Action dated Apr. 28, 2017 as received in Application No. 201480030470.0 (English Translation).
Andreas Franck, "Efficient Algorithms for Arbitrary Sample Rate Conversion with Application to Wave Field Synthesis", Nov. 30, 2011, cover page to p. 64.
Marek Blok, "Fractional Delay Filter Design for Sample Rate Conversion", Computer Science and Information Systems (FEDCSIS), 2012 Federated Conference On, IEEE, Sep. 9, 2012, pp. 701-706.
Roman Kappeler et al., "Sample Rate Converter 192 kHz Stereo Sample Rate Conversion with B-Spline Interpolation", Mar. 24, 2004, p. 1-18.
Paul Beckmann et al., "Audio Engineering Society Convention Paper "An Efficient Asynchronous Sampling-Rate Conversion Algorithm for Multi-Channel Audio Applications"", Oct. 1, 2005, pp. 1-15.
Andrew I. Russell et al., "Efficient Arbitrary Sampling Rate Conversion with Recursive Calculation of Coefficients", IEEE Transactions on Signal Processing, IEEE Service Center, New York, NY, vol. 50, No. 4, Apr. 1, 2002, pp. 854-865.
Anonymous, "Goertzel Filterbank to the Implementation of a Nonuniform DFT", DSPRelated.com, Dec. 14, 2010.
Sinan Akay et al., "Abschlussbericht DSP-Labor WS06/07: Analyse und Erweiterung eines DPOAE-Gerates zur Messung von Verzerrungsprodukten im menschlichen Ohr", Apr. 1, 2007, pp. 1-39.
Joe F. Chicharo et al., "A sliding Goertzel algorithm", Signal Processing, Elsevier Science Publishers B,V. Amsterdam, NL, vol. 52, No. 3, Aug. 1, 1996, pp. 283-297.
Brian Dickens, "Math: Howto: a "Perfect Reconstruction" Graphic Equalizer", Dec. 16, 2007.

* cited by examiner

AUDIO FILTERING WITH VIRTUAL SAMPLE RATE INCREASES

This application claims priority from U.S. patent application No. 61/805,469 filed on 26 Mar. 2013, the contents of which are to be taken as incorporated herein by this reference. This application is related to and if required claims priority from U.S. patent application Nos. 61/805,406, 61/805,432, 61/805,466, 61/805,449 and 61/805,463 all filed on 26 Mar. 2013, the contents of which are to be taken as incorporated herein by these references. This application is also related to and if required claims priority from U.S. patent application No. 61/819,630 filed on 5 May 2013 and U.S. patent application No. 61/903,225 filed on 12 Nov. 2013, the contents of which are to be taken as incorporated herein by these references.

TECHNICAL FIELD

The present invention relates broadly to a method of digitally filtering an audio signal. The invention relates particularly although not exclusively to digitally filtering an audio signal in audio equalisation (EQ). The invention extends to other digital filtering including filtering images and other signals including signals associated with digital communications and processing.

BACKGROUND ART

In digital recording and playback an analog signal representative of audio is converted into a digital signal which lends itself to manipulation and storage. The conversion is performed in an analog to digital converter (ADC). The stored digital signal can be converted back to an analog signal in a digital to analog converter (DAC). The analog signal is played back using conventional audio equipment such as amplifiers and speakers. The digital signal can be manipulated prior to the DAC to improve its quality before playback. This manipulation includes audio EQ where selected parts of the frequency spectrum of the audio are filtered to, for example, compensate for irregularities in the frequency response. The digital signal may also be filtered to resolve problems from its conversion into a digital signal or back to an analog signal.

SUMMARY OF INVENTION

According to a first aspect of the present invention there is provided a method of digitally filtering an audio signal, said method comprising the steps of:
providing an audio filter at a predetermined sample rate including neighbouring sample points;
increasing the sample rate of the audio filter to an increased sample rate from the predetermined sample rate where at the increased sample rate intermediate sample points are located between the neighbouring sample filter;
providing another audio filter at the increased sample rate including intermediate sample point between adjacent of its neighbouring sample points;
calculating a weighting for each of the intermediate sample points based on one or more waveforms substantially representative of the audio filter;
applying the weighting to the audio filter at respective of the intermediate sample points;
applying the audio filter to the other audio filter to provide a composite audio filter, said filter being applied by convolution of the audio filter with the other audio filter wherein said convolution involves shifting the audio filter relative to the other audio filter where at least one of the neighbouring sample points of the audio filter corresponds with at least one of the intermediate sample points of the other audio filter; and
filtering the audio signal using the composite audio filter.

Preferably the step calculating the weighting for each of the intermediate sample points including the steps of (i) nominating neighbouring waveforms substantially representative of the audio filter at respective of the neighbouring sample points; (ii) shifting each of the nominated waveforms in the time domain between the neighbouring sample point and the intermediate sample point, and (iii) combining values for the shifted waveforms at the intermediate sample point to derive the weighting.

Preferably the nominated neighbouring samples are shifted in the time domain substantially midway between the neighbouring sample point and the intermediate sample point.

Preferably the step of calculating the weighting for each of the intermediate sample points including the steps of (i) providing a hypothetical waveforms substantially representative of the audio filter and shifted in its time domain to align with the intermediate sample point (ii) expanding the shifted hypothetical waveforms in the time domain (iii) combining values for the expanded hypothetical waveforms at the neighbouring sample points to derive the weighting.

Preferably the nominated neighbouring samples are expanded in the time domain by a factor of substantially two.

Preferably the weighting is applied across a predetermined number of said neighbouring sample points.

Preferably the composite audio filter is a combination of a bank of filters. More preferably the bank of filters together define a frequency bandwidth generally representative of the audio signal to be filtered.

Preferably the composite audio filter is a lowpass filter which approaches the Nyquist frequency.

Preferably the one or more waveforms each includes an impulse response produced by an impulse fed to respective of the audio filters. More preferably the method also comprises the step of applying an averaging curve to frequency components of the impulse response. Still more preferably the averaging curve is adjusted to a width proportional to respective of the frequency components of the impulse response to which it is applied.

Preferably the impulse response is in the time domain represented by a sinc function. Alternatively the impulse response is in the time domain represented by a sine function of absolute values.

According to a second aspect of the invention there is provided a computer or device-readable medium including instructions for digitally filtering an audio signal using a composite audio filter, said instructions when executed by a processor cause said processor to:
provide an audio filter at a predetermined sample rate including neighbouring sample points;
increase the sample rate of the audio filter to an increased sample rate from the predetermined sample rate where at the increased sample rate intermediate sample points are located between the neighbouring sample points;
provide another audio filter at the increased sample rate including intermediate sample points between adjacent of its neighbouring sample points;

calculate a weighting for each of the intermediate sample points based on one or more waveforms substantially representative of the audio filter;

apply the weighting to the audio filter at respective of the intermediate sample points;

apply the audio filter to the other audio filter to provide the composite audio filter, said filter being applied by convolution of the audio filter with the other audio filter wherein said convolution involves shifting the audio filter relative to the other audio filter where at least one of the neighbouring sample points of the audio filter corresponds with at least one of the intermediate sample points of the other audio filter; and filter the audio signal using the composite audio filter.

According to a third aspect of the invention there is provided a system for digitally filtering an audio signal, said system comprising:

an audio filter at a predetermined sample rate including neighbouring sample points;

a processor configured to:

increase the sample rate of the audio filter to an increased sample rate from the predetermined sample rate where at the increased sample rate intermediate sample points are located between the neighbouring sample points;

provide another audio filter at the increased sample rate including intermediate sample points between adjacent of its neighbouring sample points;

calculate a weighting for each of the intermediate sample points based on one or more waveforms substantially representative of the audio filter;

apply the weighting to the audio filter at respective of the intermediate sample points;

apply the audio filter to the other audio filter to provide a composite audio filter, said filter being applied by convolution of the audio filter with the other audio filter wherein said convolution involves shifting the audio filter relative to the other audio filter where at least one of the neighbouring sample points of the audio filter corresponds with at least one of the intermediate sample points of the other audio filter; and filter the audio signal using the composite audio filter.

According to a fourth aspect of the invention there is provided a method of digitally filtering an image, said method comprising the steps of:

providing an image filter at a predetermined sample rate including neighbouring sample points;

increasing the sample rate of the image filter to an increased sample rate from the predetermined sample rate where at the increased sample rate intermediate sample points are located between the neighbouring sample points;

providing another image filter at the predetermined sample rate including an intermediate sample point between adjacent of its neighbouring sample points;

calculating a weighting for each of the intermediate sample points based on one or more waveforms substantially representative of the image filter;

applying the weighting to the image filter at respective of the intermediate sample points;

applying the image filter to the other image filter to provide a composite image filter, said image filter being applied by convolution of the image filter with the other image filter wherein said convolution involves shifting the image filter relative to the other image filter where at least one of the neighbouring sample points of the image filter corresponds with at least one of the intermediate sample points of the other image filter; and filtering the image signal using the composite image filter.

According to a fifth aspect of the invention there is provided a method of digitally filtering a digital signal including an electronic signal derived from displacement of a transducer or measurement device, said method comprising the steps of:

providing a digital filter at a predetermined sample rate including neighbouring sample points;

increasing the sample rate of the audio filter to an increased sample rate from the predetermined sample rate where at the increased sample rate intermediate sample points are located between the neighbouring sample points;

providing another digital filter at the predetermined sample rate including intermediate sample points between adjacent of its neighbouring sample points;

calculating a weighting for each of the intermediate sample points based on one or more waveforms substantially representative of the digital filter;

applying the weighting to the digital filter at respective of the intermediate sample points;

applying the digital filter to the other digital filter to provide a composite digital filter, said digital filter being applied by convolution of the digital filter with the other digital filter wherein said convolution involves shifting the digital filter relative to the other digital filter where at least one of the neighbouring sample points of the digital filter corresponds with at least one of the intermediate sample points of the other digital filter; and filtering the digital signal using the composite digital filter.

BRIEF DESCRIPTION OF DRAWINGS

Some embodiments of the present invention described herein relate to a method of digitally filtering an audio signal, which will now be described, by way of example only, with reference to the accompanying drawings in which.

DESCRIPTION OF EMBODIMENTS

Some embodiments of the present invention herein are directed to a method of digitally filtering an audio signal by applying a composite audio filter. The composite audio filter may be obtained by applying one audio filter to another audio filter each having the same predetermined sample rate including neighbouring sample points. The other audio filter may also include one or more intervening sample points between adjacent of its neighbouring sample points. The one audio filter may be applied to the other audio filter at an adjusted sampling rate relative to the other audio filter. In some embodiments, the adjusted sampling rate may be inversely proportional to the number of intervening sample points relative to the number of neighbouring sample points for the other filter.

Figure 1:
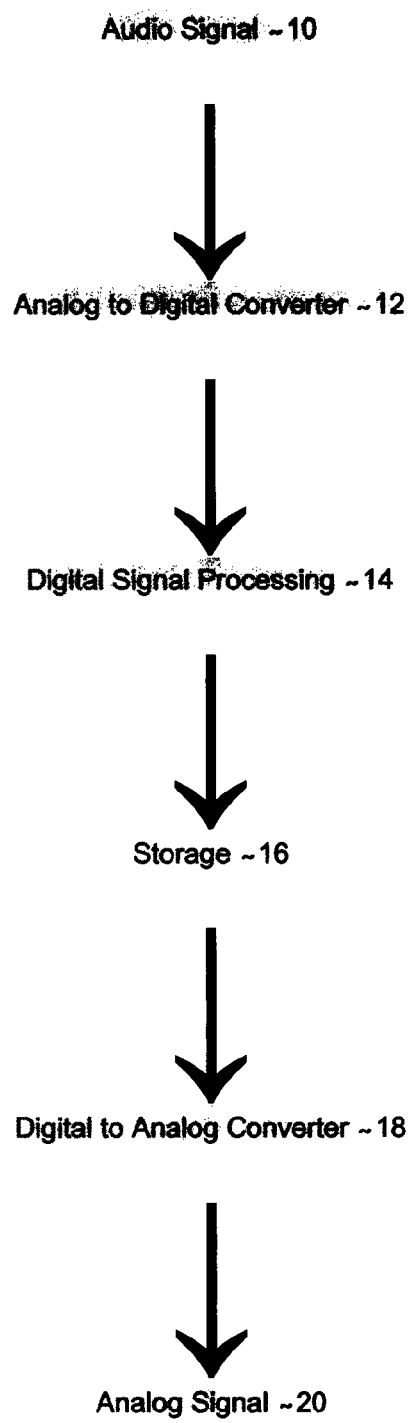
FIG. 1 is a schematic of application of embodiments of the invention in digital audio recording and playback.

FIG. 1 shows application of some embodiments of the invention in the course of digital audio recording and playback. The analog audio signal 10 may be converted to a digital audio signal at an analog to digital converter (ADC) 12. The digital audio signal may then be subject to signal processing at digital processor 14, for example in audio equalisation (EQ). The processed digital signal may be down-sampled and stored at storage memory 16 before a sample rate increase to increase its resolution prior to playback. The relatively high resolution digital audio signal may be then converted back to an analog signal 20 at a digital to analog converter (DAC 18).

It will be understood that some embodiments of the invention can be applied:
  i) at the ADC 12 where the digital audio signal undergoes a sample rate increase or over-sampling, in some embodiments with weighting;
  ii) at the digital signal processor 14 or a digital filter associated with EQ where, for example, the digital signal may be filtered with a lowpass filter or bandpass filter; and/or
  iii) downstream of the storage memory 16 where the filtered audio signal may undergo a sample rate increase or up-sampling prior to playback.

Some embodiments herein relate to a method embodied in computer program code or software. The digital filter of the digital signal processor 14 may be represented by a particular frequency response. The particular frequency response may be generally dependent on the impulse response of the filter which may be characterised by the software or techniques of the various embodiment of this invention. Some embodiments described herein may cover the basic types of frequency response by which digital filters may be classified including lowpass, highpass, bandpass and bandreject or notch filters. The digital filters may be broadly categorised as Finite Impulse Response (FIR) or Infinite Impulse Response (IIR) filters.

To ease understanding of the audio filtering involving an adjusted sampling rate, in some embodiments, the composite audio filter is for simplicity derived from two (2) audio filters although it would be appreciated that any number of filters may be used. The composite audio filter may generally include a bank of filters.

In some embodiments, the bank of filters together may define a frequency bandwidth representative of the audio signal or spectrum to be filtered. In some embodiments an impulse response is produced by an impulse fed to the respective filter. The impulse response for each of the filters may be represented by a sinc function according to the equation:

$$\frac{e^{-(qx)^2}\sin[2\pi x/1pf]}{2\pi x} \quad \text{Equation 1}$$

where lpf is the corner frequency for the lowpass filter, x is the time variable on the x-axis, and $e^{-(qx)^2}$ represents an averaging curve with q representing the aspect ratio of the averaging curve. It is to be understood that the sinc function is the sum of cosine components.

Figure 2:
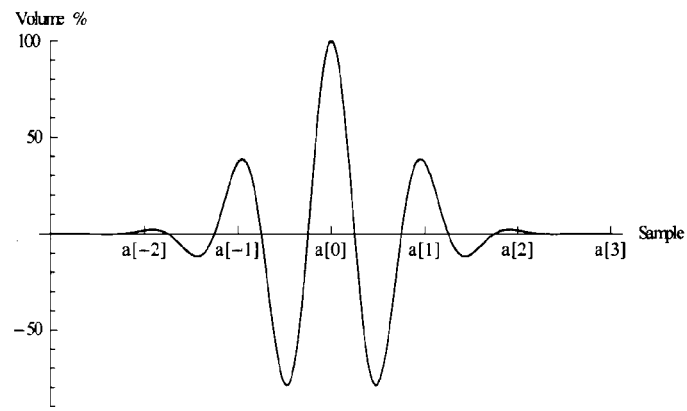
FIG. 2 is an impulse response of an audio filter of some embodiments of the invention.

FIG. 2 illustrates the impulse response of equation 1. It is to be understood that a[0] is the instance at which the impulse occurs and a[n] designates neighbouring sample points for the impulse response where n is the number of the sample point at the predetermined sample rate. In some embodiments the predetermined sample rate may be 44.1 kHz (samples per second) although it will be appreciated that any other sample rate may be used depending on the application.

Figure 3:
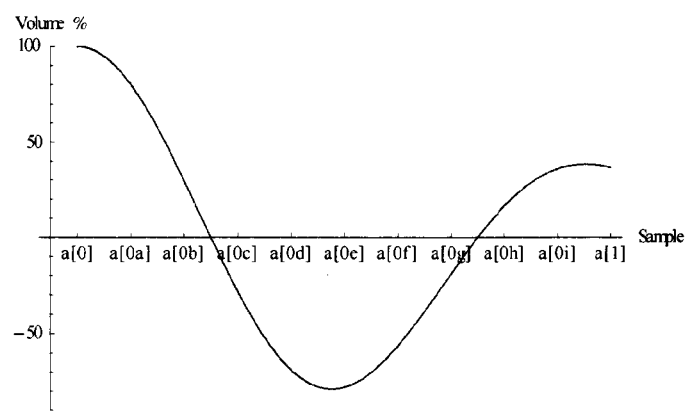
FIG. 3 is an enlarged view of the impulse response of FIG. 2 with an increased sample rate.

In some examples, each of the audio filters may undergo an increased sample rate from the predetermined sample rate. FIG. 3 illustrates an enlarged view of the impulse response of FIG. 2 with a sample rate increase to the increased sample rate. For illustrative purposes only the predetermined sample rate is increased by a factor of ten (10) with nine (9) intermediate and equally spaced sample points designated a[0a] to a[0i] located between neighbouring sample points such as a[0] and a[1]. The predetermined sample rate may in practice be increased by a factor of up to 1,000 where the increased sample rate is 44,100 kHz.

In some embodiments, the filters are applied to one another by convolution to obtain the composite audio filter. This convolution of impulse responses a and b may be represented by an array of samples which can also be mathematically defined by the equation:

$$\sum_{n=0}^{N-1} a[n] \times b[k-n] \quad \text{Equation 2}$$

where N is the number of samples for each of impulse responses a and b, and k is from 0 to N−1 for each of the samples for impulse response b. The array of samples thus includes 2N−1 rows and columns. The sum of the sample values for each row of the array may represent the composite audio filter. In some embodiments, the composite audio filter may be represented mathematically by integrating the impulse responses across an infinite number of samples.

The composite audio filter may be in some examples a lowpass filter which approaches the Nyquist frequency. The Nyquist frequencies and above are substantially removed in performing the sample rate increase on the various impulse responses. The composite filter or other composite filters may also function as band pass or band reject filter depending on the application.

In some embodiments, the composite audio filter may be "constructed" with the benefit of increased accuracy at the increased sample rate. The composite audio filter may be returned to the predetermined sample rate prior to filtering the audio signal. The composite filter may thus be applied to the audio signal at the predetermined sample rate with a virtual sample rate increase which is less demanding in terms of processor power.

The sample rate increase on each of the audio filters in some embodiments may be performed by various techniques, which may involve i) shifted neighbouring audio signals, and/or ii) expanded hypothetical audio signal.

Figure 4:
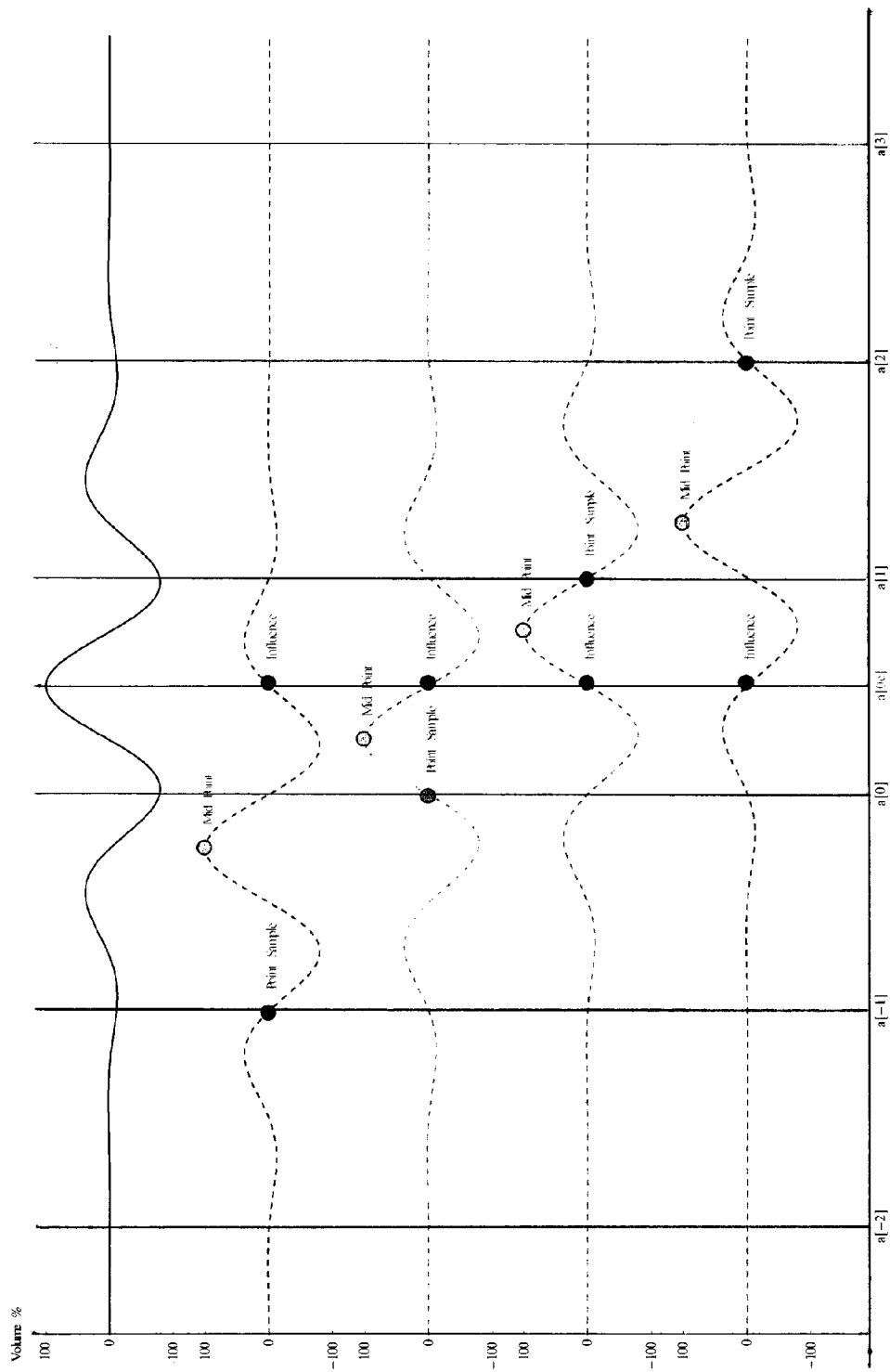
FIG. 4 is a schematic of an example technique for increasing the sample rate of an impulse response.

In weighting values of the impulse response using the shifted audio signals, neighbouring impulse responses may be nominated for either side of the intermediate sample point to be determined. Each of these nominated neighbouring signals may be shifted in the time domain between the neighbouring sample point and the intermediate sample point. In some examples, the relevant weighting may be calculated by summing values which each of the shifted and nominated neighbouring impulse responses contribute at the relevant intermediate sample points. This technique is schematically illustrated in FIG. 4. The weighting may be applied across a predetermined number of the neighbouring sample points, for example 1,024 sample points.

Figure 5:
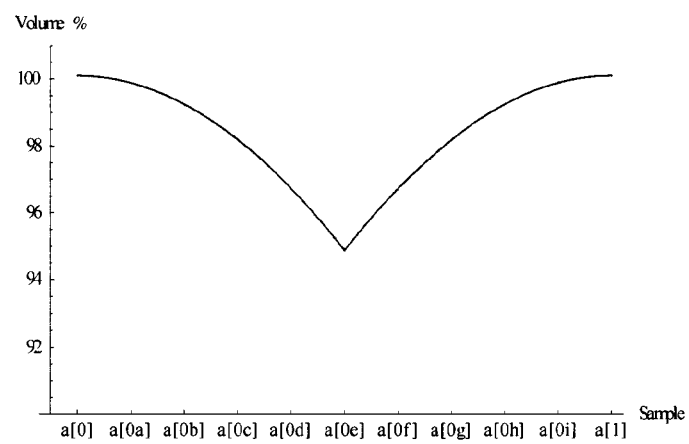
FIG. 5 is a graph depicting weightings for intermediate sample points to be applied to relevant audio values.

FIG. 5 illustrates the weightings for each of the intermediate sample points a[oa] to a[oi] to be applied to the relevant impulse response.

Figure 6:
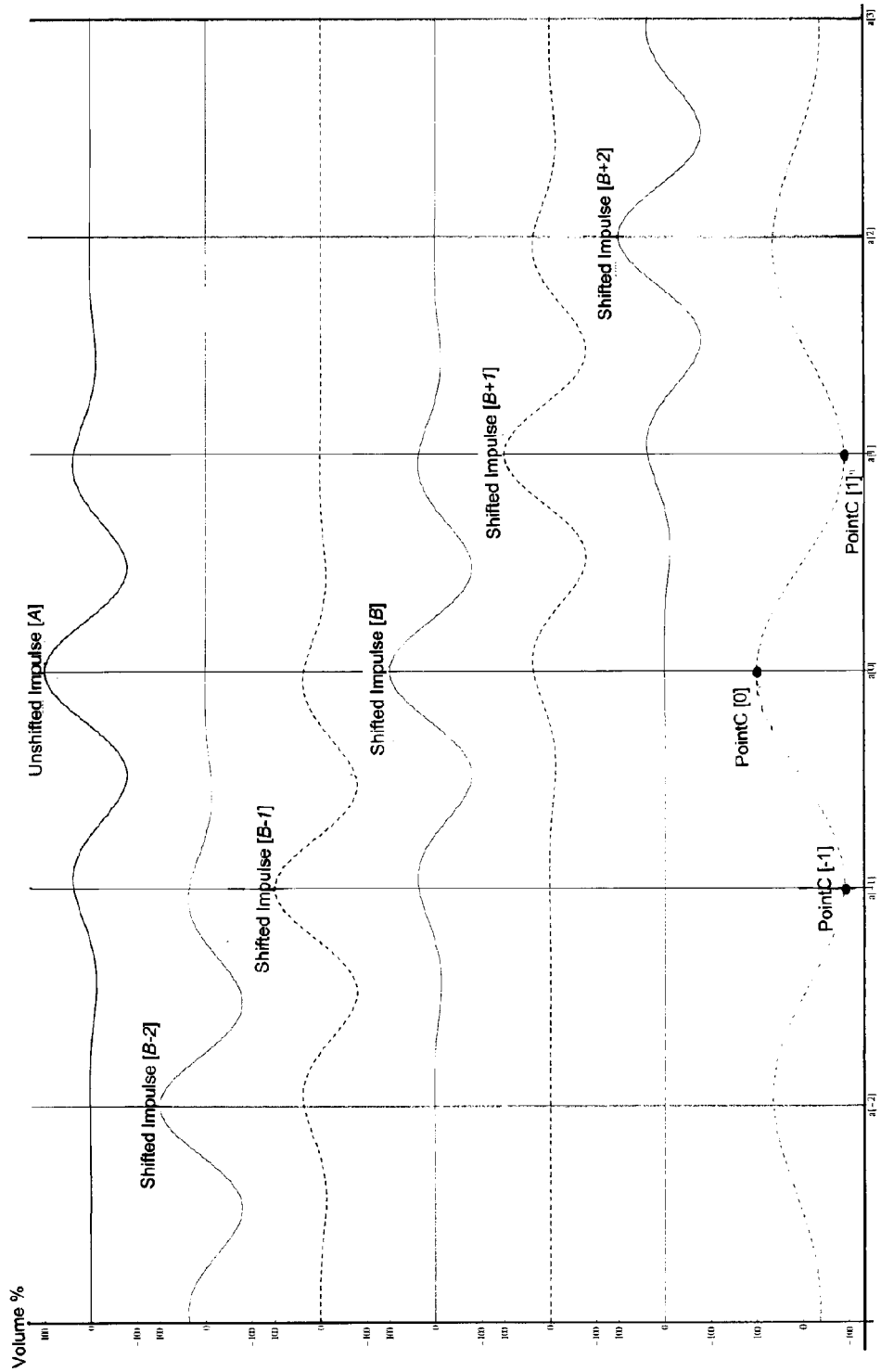
FIG. 6 is a schematic of an example technique for adjusting the sampling rate according to an embodiment of the invention.

In some embodiments, the convolution of the audio filters may be performed at the adjusted sampling rate so that neighbouring sample points for the audio filter align or correspond with at least each of the intervening sample points of the other audio filter to which it is applied. This may involve shifting the audio filter at the adjusted sampling rate relative to the other audio filter. For example, if the other audio filter includes intervening sample points located substantially midway between adjacent of its neighbouring sample points, the adjusted sampling rate for applying the filters to one another may be substantially one-half the predetermined sample rate. FIG. 6 schematically illustrates one technique for adjusting the sampling rate. In some embodiments, the sampling rate of the filter may be adjusted by halving the frequency of the filter to for example approximately one-half of the Nyquist frequency or around 11 kHz when the Nyquist frequency is approximately 22 kHz.

The sampling rate may be adjusted in some embodiments by convolving every other impulse response. This means the uppermost impulse response of FIG. 6 is convolved with the three (3) impulse responses shown in solid line detail and the other impulse responses shown in broken line detail are effectively ignored. The resulting or composite audio filter is the lowermost impulse response of FIG. 6 shown in broken line detail and can in some examples be represented by the following equations.

New Convolved PointC[ . . . 1] is Σ Impulse[A]*Impulse[B . . . 2]

New Convolved PointC[0] is Σ Impulse[A]*Impulse[B]

New Convolved PointC[1] is Σ Impulse[A]*Impulse[B+2]    Equations 3

For a predetermined sample rate of 44.1 kHz the adjusted sampling rate in this example is 22.05 kHz. If the other audio filter includes nine (9) intervening sample points between adjacent of its neighbouring sample points the adjusted sample rate may be one tenth of the predetermined sample rate. This equates to an adjusted sampling rate of 4.41 kHz for a predetermined sample rate of 44.1 kHz. It is understood that adjusting the sampling rate "corrects" for shifting of the nominated neighbouring sample points in calculating weightings for each of the intermediate sample points. The shift in the nominated neighbouring samples in the time domain is generally proportional to the adjustment in the sampling rate in convolving the audio filters. Thus, a shift in the nominated neighbouring signals midway between neighbouring sample point and the intermediate sample point may mean an adjustment in the sampling rate by a factor of substantially one-half.

This convolution of impulse responses a and b may provide an array of samples as represented by for example equation 2. However, with the adjusted sampling rate there may be N samples for impulse response a and M samples for impulse response b. The array of samples may thus include (N+M)−1 rows and M columns. The sum of the sample values for each row of the array may represent the composite audio filter.

Figure 7:
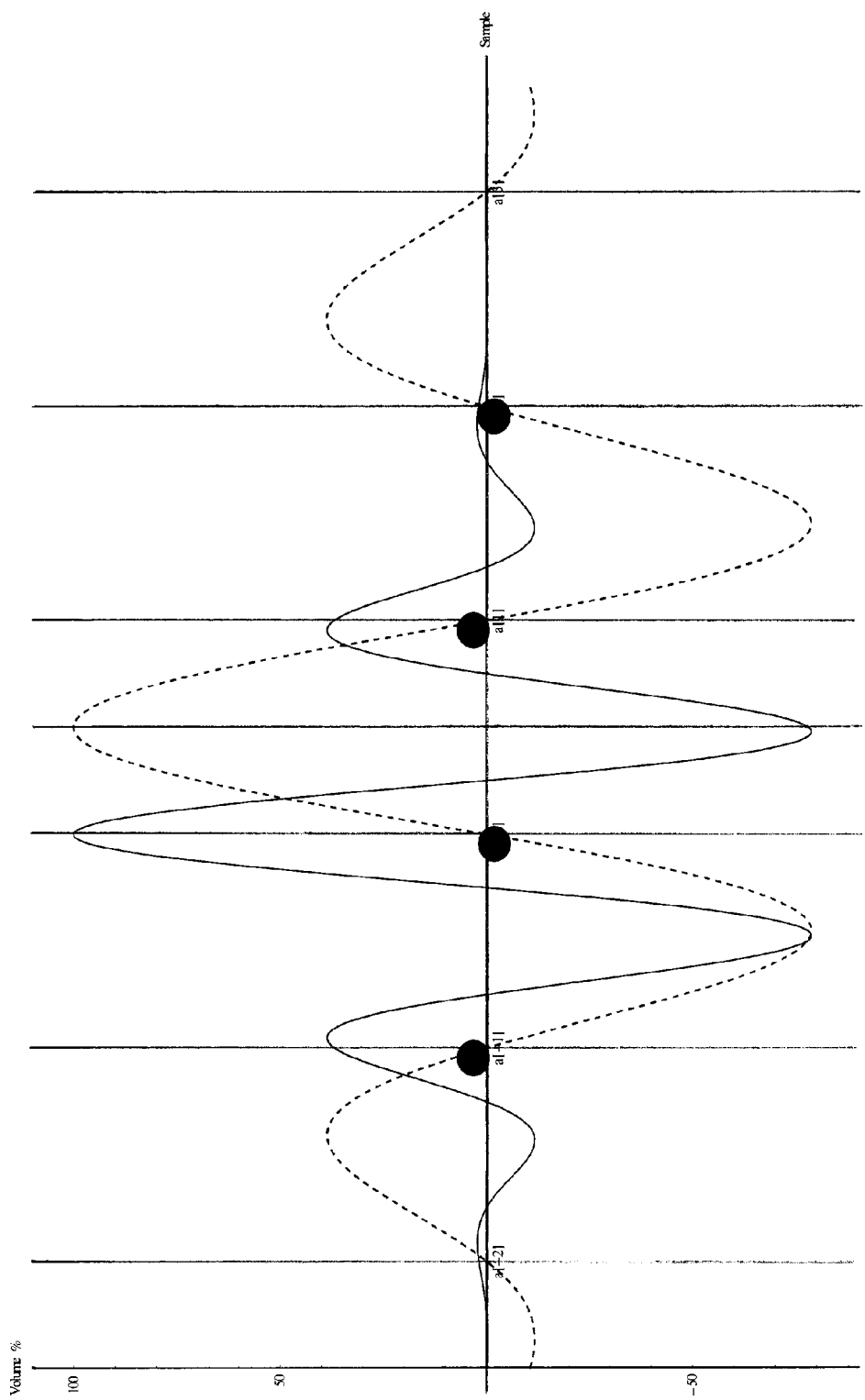
FIG. 7 is a schematic of another example technique for increasing the sample rate of an impulse response.

In weighting values of the impulse response using the expanded hypothetical audio signal, the relevant impulse response may be effectively replicated as a hypothetical impulse response with its time domain shifted to align with the intermediate sample point to be determined. The hypothetical and shifted impulse response may then be expanded in the time domain. In some examples, the relevant weighting may be calculated by summing values for the expanded impulse response at the neighbouring sample points. This technique is schematically illustrated in FIG. 7. The weighting is preferably applied across a predetermined number of the neighbouring sample points, for example 1,024 sample points.

In some embodiments, the nominated neighbouring signals may be expanded in the time domain by a factor of substantially 2. This may "correct" for the adjusted sampling rate of one-half the predetermined sample rate. It will be appreciated that other expansion factors may be used in calculating the weighting for intermediate sample points in which case the adjusted sampling rate may be inversely proportional to this expansion factor.

Figure 8:
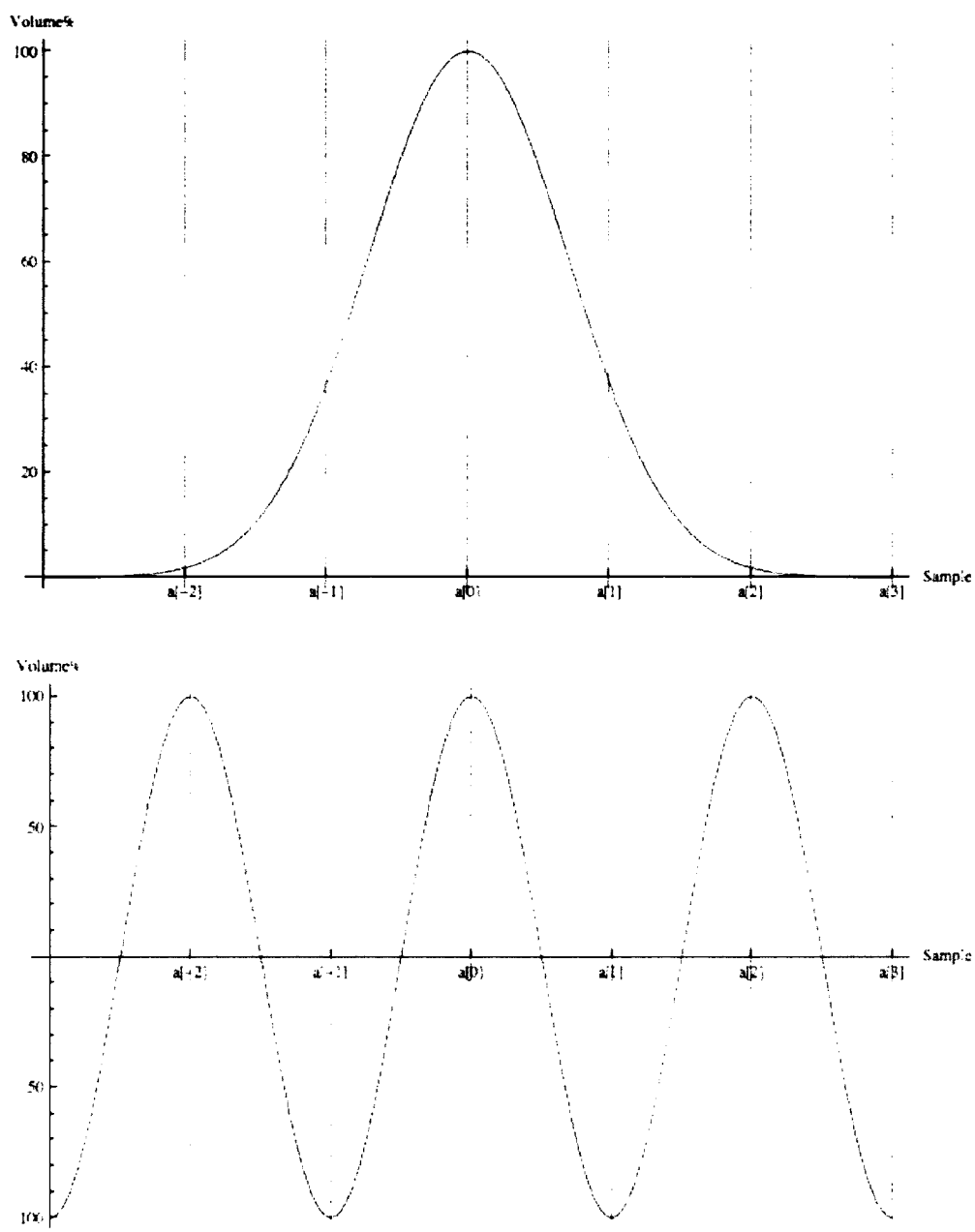
FIGS. 8 and 9 illustrate averaging curves applied to respective impulse responses according to some embodiments of the invention.
Figure 9:
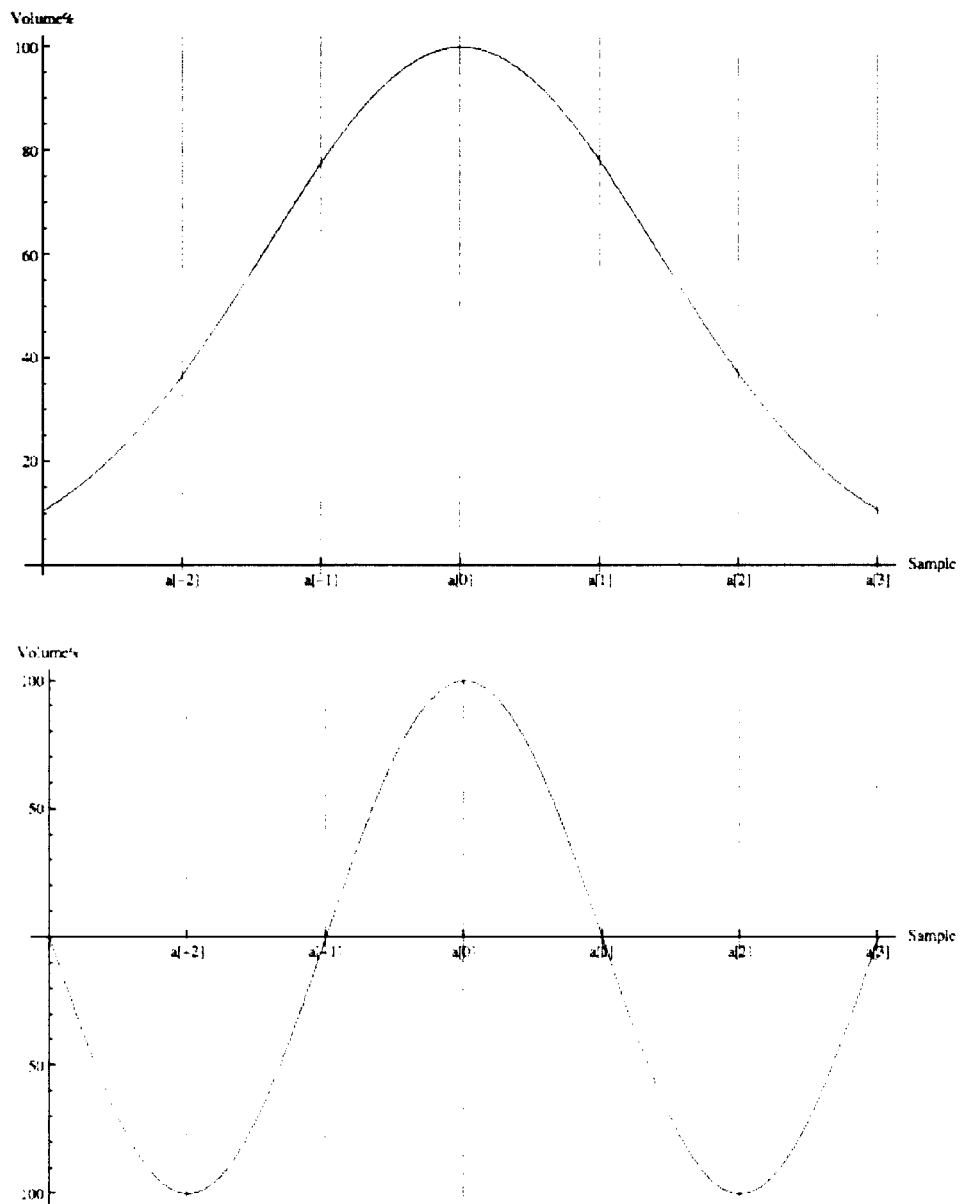
Figure 10:
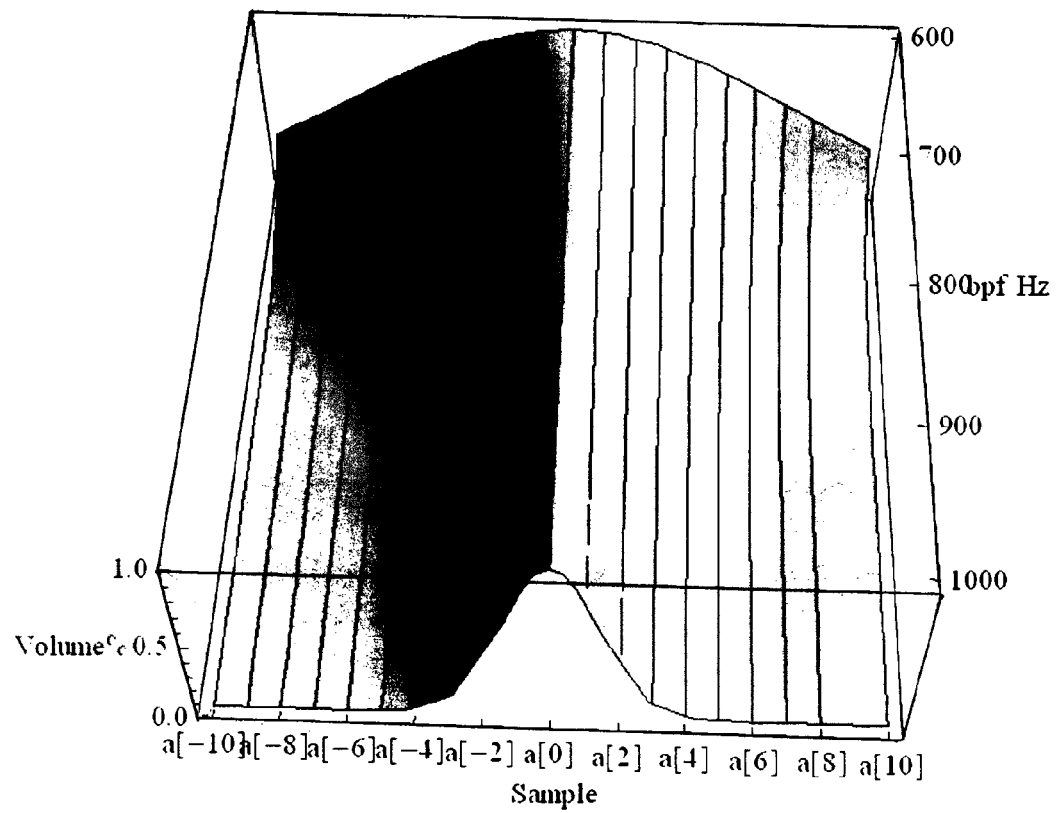
FIG. 10 is a graph depicting averaging curves of different widths as a function of the frequency of the impulse response.

In some embodiments, the averaging curve applied to the impulse response may be adjusted to a width proportional to the frequency of the impulse response to which it is applied. FIG. 8 illustrates an averaging curve having a width of around four (4) samples applied to an impulse response having a relatively high frequency. FIG. 9 shows an adjusted averaging curve having a width of around eight (8) samples applied to another impulse response having a relatively low frequency. It can be seen that in both cases the width or q of the averaging curve may be substantially proportional to the frequency of the corresponding impulse response. This is schematically shown in FIG. 10 where the width of the averaging curve increases in the z-axis with decreasing frequency in the impulse response.

Figure 11:
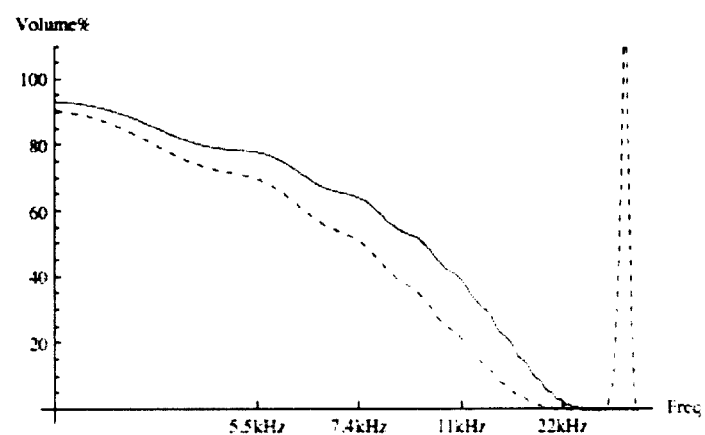
FIG. 11 is a frequency response of a filter of an embodiment of the invention with adjusted sampling compared with frequency response without adjusted sampling (shown in broken line detail).

It can be seen from the comparative frequency response curves of FIG. 11 that with the adjusted sampling rate the frequency response may be more indicative of an idealised lowpass filter. The frequency response with an adjusted sampling rate according to an embodiment of the invention displays a more bell-shaped characteristic compared with the frequency response without an adjusted sampling rate (shown in broken line detail).

Now that several embodiments of the invention have been described it will be apparent to those skilled in the art that a method of digitally filtering an audio signal has at least the following advantages over the prior art:

1. The composite audio filter may be derived at the increased sample rate which provides a relatively "smooth" filter in its frequency response;
2. The composite filter may provide improved filtering in for example EQ;
3. The composite filter "design" may be akin to analog insofar as it is "constructed" from filters at significantly increased sample rates;
4. The composite audio filter may substantially reduce unwanted resonants inherent in analog and prior digital filters;
5. The method provides a frequency response which may be smoother and in this respect more akin to an analog filter.

6. The composite filter may be applied to the relevant audio at relatively high resolution without requiring a sample rate increase;
7. The filtered audio may be substantially phase coherent relative to the signal to be filtered Those skilled in the art will appreciate that the invention described herein is susceptible to variations and modifications other than those specifically described. For example, the impulse response may be of practically any waveform. If represented by a mathematical equation, the impulse response is not limited to a sinc function but includes other waveforms such as, but not limited to:
  i) a sine function of absolute values represented in the time domain; and
  ii) a sine function of values from zero (0) to positive infinity only;
  iii) a sinc function (sum of cosine components) for positive values only.

The processing of audio signals need not be limited to acoustics but extends to other sound applications including ultrasound and sonar. The invention also extends beyond audio signals to other signals including signals derived from a physical displacement such as that obtained from measurement devices, for example a strain gauge or other transducer which generally converts displacement into an electronic signal. The invention also covers digital filtering of signals associated with digital communications.

The invention in some embodiment may be applied to imaging. For example, each of the pixels in a matrix of pixels in the image may be filtered with a composite filter obtained by applying filters to one another at an adjusted sampling rate. The adjusted sampling rate may be inversely proportional to the number of intervening sample points relative to the number of neighbouring sample points for the other filter.

All such variations and modifications are to be considered within the scope of the present invention the nature of which is to be determined from the foregoing description.

The invention claimed is:

1. A method of digitally filtering an audio signal, said method comprising the steps of:
  providing an audio filter represented by an impulse response of said filter, the impulse response including a plurality of neighbouring sample points;
  increasing the sample rate of the impulse response of the audio filter to an increased sample rate by introducing a plurality of intermediate sample points are located adjacent of the plurality of neighbouring sample points;
  providing another audio filter represented by another impulse response of said other audio filter, said other impulse response provided at the increased sample rate including a plurality of intermediate sample points between adjacent of its neighbouring sample points;
  for each of the impulse responses:
    i) calculating a weighting for each of the plurality of intermediate sample points based on one or more waveforms representative of the impulse response;
    ii) applying the weighting to the impulse response at respective intermediate sample points;
  applying the impulse response of the audio filter to the other impulse response of the other audio filter by convolution of said impulse responses with one another to provide a composite audio filter; and
  filtering the audio signal using the composite audio filter.

2. A method as defined in claim 1 wherein the step of calculating the weighting for each of the intermediate sample points includes the steps of (i) nominating neighbouring waveforms representative of the impulse response of the audio filter at respective of the neighbouring sample points; (ii) shifting each of the nominated waveforms in the time domain between the neighbouring sample point and the intermediate sample point; and (iii) combining values for the shifted waveforms at the intermediate sample point to derive the weighting.

3. A method as defined in claim 2 wherein the nominated waveforms are shifted in the time domain midway between the neighbouring sample point and the intermediate sample point.

4. A method as defined in claim 2 wherein the step of calculating the weighting for each of the intermediate sample points includes the steps of (i) providing a waveform representative of the impulse response of the audio filter and shifted in its time domain to align with the intermediate sample point; (ii) expanding the shifted waveform in the time domain; and (iii) combining values for the expanded waveform at the neighbouring sample points to derive the weighting.

5. A method as defined in claim 4 wherein the hypothetical waveform is expanded in the time domain by a factor of two.

6. A method as defined in claim 2 wherein the weighting is applied across a predetermined number of said neighbouring sample points.

7. A method as defined in claim 1 wherein the composite audio filter is a combination of a bank of filters.

8. A method as defined in claim 7 wherein the bank of filters together define a frequency bandwidth representative of the audio signal to be filtered.

9. A method as defined in claim 1 wherein the composite audio filter is a lowpass filter which approaches the Nyquist frequency.

10. A method as defined in claim 1 wherein the method also comprises the step of applying an averaging curve derived from a time-domain exponential factor to the waveform of respective impulse responses.

11. A method as defined in claim 10 wherein the averaging curve is adjusted to a width inversely proportional to the frequency of the waveform of the impulse response to which it is applied.

12. A method as defined in claim 1 wherein the impulse response is in the time domain represented by a sinc function.

13. A method as defined in claim 1 wherein the impulse response is in the time domain represented by a sine function of absolute values.

14. A non-transitory computer readable medium including instructions for digitally filtering an audio signal using a composite audio filter, said instructions when executed by a processor cause said processor to:
  provide an audio filter represented by an impulse response of said filter, the impulse response including a plurality of neighbouring sample points;
  increase the sample rate of the impulse response of the audio filter to an increased sample rate by introducing a plurality of intermediate sample points are located adjacent to the plurality of neighbouring sample points;
  provide another audio filter represented by another impulse response of said other audio filter, said other impulse response provided at the increased sample rate including a plurality of intermediate sample points between adjacent of its neighbouring sample points;
  for each of the impulse responses:

i) calculate a weighting for each of the plurality of intermediate sample points based on one or more waveforms representative of the impulse response;

ii) apply the weighting to the impulse response at respective intermediate sample points;

apply the impulse response of the audio filter to the other impulse response of the other audio filter by convolution of said impulse responses with one another to provide the composite audio filter; and filter the audio signal using the composite audio filter.

15. A system for digitally filtering an audio signal, said system comprising:

an audio filter represented by an impulse response of said filter, the impulse response including a plurality of neighbouring sample points;

a processor configured to:

increase the sample rate of the impulse response of the audio filter to an increased sample rate by introducing a plurality of intermediate sample points adjacent of the plurality of neighbouring sample points;

provide another audio filter represented by another impulse response of said other audio filter, said other impulse response provided at the increased sample rate including a plurality of intermediate sample points between adjacent of its neighbouring sample points;

for each of the impulse responses:

i) calculate a weighting for each of the plurality of intermediate sample points based on one or more waveforms representative of the impulse response;

ii) apply the weighting to the impulse response at respective intermediate sample points;

apply the impulse response of the audio filter to the other impulse response of the other audio filter by convolution of said impulse responses with one another to provide a composite audio filter; and filter the audio signal using the composite audio filter.

16. A non-transitory computer readable medium including instructions which when executed implements the method of claim 1.

* * * * *